(12) United States Patent
Hayashi

(10) Patent No.: US 6,362,503 B1
(45) Date of Patent: Mar. 26, 2002

(54) LOW TEMPERATURE PROCESS FOR FABRICATING LAYERED SUPERLATTICE MATERIALS AND MAKING ELECTRONIC DEVICES INCLUDING SAME

(76) Inventor: Shinichiro Hayashi, 2-9-3-301 Nasahara, Takatsuki, Osaka 569-1041 (JP)

(*) Notice: Subject to any disclaimer, the term of this patent is extended or adjusted under 35 U.S.C. 154(b) by 0 days.

(21) Appl. No.: 09/624,158

(22) Filed: Jul. 24, 2000

Related U.S. Application Data

(62) Division of application No. 09/122,562, filed on Jul. 24, 1998, now Pat. No. 6,133,092.

(51) Int. Cl.$^7$ .................. H01L 27/108; H01L 29/76; H01L 29/94; H01L 31/119
(52) U.S. Cl. ........................ 257/310; 257/295
(58) Field of Search ................... 257/310, 295, 257/43; 438/3, 256, 399, 239, 386

(56) References Cited

U.S. PATENT DOCUMENTS 5,508,226 A * 4/1996 Ito et al. ............... 427/79

\* cited by examiner

*Primary Examiner*—Olik Chaudhuri
*Assistant Examiner*—Theresa T. Doan
(74) *Attorney, Agent, or Firm*—Patton Boggs LLP

(57) ABSTRACT

A liquid precursor containing thallium is applied to a first electrode, RTP baked at a temperature lower than 725° C., and annealed at the same temperature for a time period from one to five hours to yield a ferroelectric layered superlattice material. A second electrode is formed to form a capacitor, and a second anneal is performed at a temperature lower than 725° C. If the material is strontium bismuth thallium tantalate, the precursor contains (m−1) mole-equivalents of strontium for each of (2.2−x) mole-equivalents of bismuth, x mole-equivalents of thallium, and m mole-equivalents of tantalum, where m=2 and $0.0 < x \leq 2.2$.

8 Claims, 3 Drawing Sheets

LOW TEMPERATURE PROCESS FOR FABRICATING LAYERED SUPERLATTICE MATERIALS AND MAKING ELECTRONIC DEVICES INCLUDING SAME

This application is a divisional application of application Ser. No. 09/122,562 filed Jul. 24, 1998 now U.S. Pat. No. 6,133,092.

BACKGROUND OF THE INVENTION

1. Field of the Invention

The invention in general relates to the fabrication of layered superlattice materials, and more particularly to low-temperature fabrication processes that provide sufficient polarizability and moderate coercivity in ferroelectric integrated circuit devices.

2. Statement of the Problem

Researchers have been attempting for at least 30 years to produce a commercially viable electronic memory utilizing the polarizability property of ferroelectric materials. Such a memory would be non-volatile, of high density, and have many other advantages. See, for example, U.S. Patent No. 5,046,043 issued to William D. Miller, et al.

The layered superlattice materials disclosed in U.S. Pat. No. 5,519,234 possess superior ferroelectric properties, making it possible to fabricate commercially viable non-volatile memories. These properties include high polarizability and low fatigue.

The prior art discloses that annealing temperatures of at least 750–850° C. are usually required to obtain good electrical properties in thin films. U.S. Pat. No. 5,508,226 teaches a low-temperature process for fabricating layered superlattice materials. Nevertheless, in two of its three examples, annealing was performed at 800° C., while in one example annealing was at 700° C., but for five hours duration. While temperatures of 750–850° C. are much lower than temperatures previously used to form bulk ceramic materials, there still remains some interlayer atomic migration through the thin films at this temperature. For example, titanium used as an adhesion layer in electrodes migrates to the ferroelectric material and to the silicon. This atomic migration sometimes changes contact resistances and other properties, thus making it difficult or impossible to use the layered superlattice materials with transistors and other conventional electrical components made with conventional silicon technology.

It would be useful, therefore, if a method and a structure existed whereby integrated circuit material could be heat-treated at temperatures lower than 750–850° C., yet still possess good ferroelectric properties. The lower temperatures would reduce interlayer diffusion and consequently result in less degradation of ferroelectric properties resulting from diffusion degradation.

3. Solution to the Problem

The present invention provides a fabrication process that utilizes only temperatures lower than 725° C., and preferably about 650° C. or less, to fabricate high quality ferroelectric integrated circuit devices.

The invention provides materials and a low-temperature method for fabricating a layered superlattice material. A liquid precursor is formed containing metal moieties in effective amounts for spontaneously yielding a ferroelectric layered superlattice material upon drying and heating of the precursor. The precursor contains a thallium moiety in an effective amount for being a superlattice generator element in the layered superlattice material. The precursor is applied to the substrate; dried to form a solid material on the substrate; and heated in oxygen at a temperature of between 600° C. and 725° C. to form a thin film of the layered superlattice material on the substrate.

Preferably, the step of heating includes rapid thermal processing the precursor at a temperature of 650° C. The step of heating preferably includes annealing the material for about three hours, and up to five hours. Preferably, the annealing temperature is about 650° C. The substrate preferably includes a first electrode and a second electrode, preferably formed on the layered superlattice material, after the step of annealing, to form a capacitor. Then, a second heating step is performed. Preferably the second heating step is a second anneal performed at a temperature lower than 725° C., and preferably about 650° C. Preferably, the wafer is an integrated circuit wafer, and the method further includes the step of completing the fabrication of the integrated circuit wafer to form a plurality of interconnected electrical devices on the wafer.

The present invention primarily concerns ferroelectric layered superlattice materials having the general chemical formula:

$$A_{m-1}S_2B_mO_{3m+3},$$

in which at least a portion of the superlattice generator elements represented by S is thallium. In particular, the invention is concerned primarily with the ferroelectric layered superlattice materials represented by the general formula:

$$A_{m-1}(S1_{y-x}S2_x)B_mO_{3m+3},$$

wherein S1 represents bismuth, S2 represents thallium, $2 \leq y \leq 2.4$ and $0 < x \leq y$. Preferably, the layered superlattice material comprises strontium bismuth thallium tantalate made from a precursor containing relative amounts of metalorganic compounds corresponding approximately to the following general chemical formula:

$$A_{m-1}(S1_{2.2-x}S2_x)B_mO_{3m+3},$$

where A is the element strontium, S1 is bismuth and S2 is thallium, B is tantalum, m=2 and $0 < x \leq 2.2$. Preferably, x=0.55.

In another aspect, the invention provides an integrated circuit device containing layered superlattice material in which thallium is a superlattice generator element. In a preferred embodiment, the invention provides a capacitor including a first electrode, a second electrode and a thin film of layered superlattice material containing thallium as a superlattice generator element. Preferably, the layered superlattice material comprises strontium bismuth thallium tantalate made from a precursor containing relative amounts of metalorganic compounds corresponding approximately to the following general chemical formula:

$$A_{m-1}(S1_{2.2-x}S2_x)B_mO_{3m+3},$$

where A is the element strontium, S1 is bismuth and S2 is thallium, B is tantalum, m=2 and $0 < x \leq 2.2$. Preferably, x=0.55.

In still another aspect, the invention provides a liquid precursor containing relative amounts of metalorganic compounds corresponding approximately to the following general chemical formula:

$$A_{m-1}(S1_{2.2-x}S2_x)B_mO_{3m+3},$$

where A is the element strontium, S1 is bismuth and S2 is thallium, B is tantalum, m=2 and $0<x\leq2.2$. Preferably, x=0.55.

Numerous other features, objects and advantages of the invention will become apparent from the following description when read in conjunction with the accompanying drawings.

DESCRIPTION OF THE PREFERRED EMBODIMENT

1. Overview.

Figure 2:
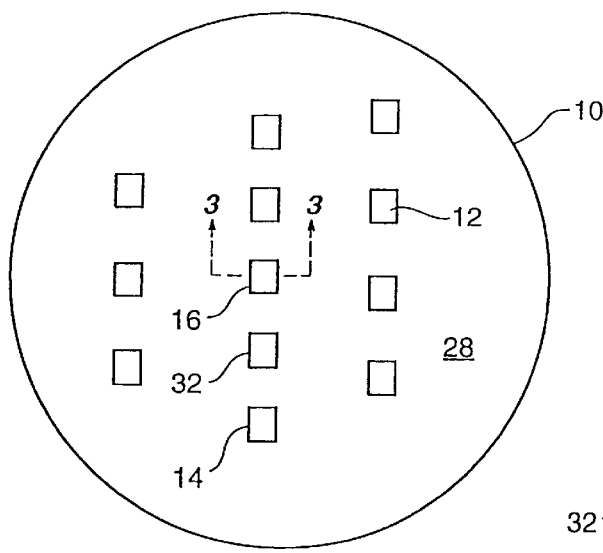
FIG. 2 is a top view of a wafer on which thin film capacitors fabricated by the process according to the invention are shown greatly enlarged.
Figure 3:
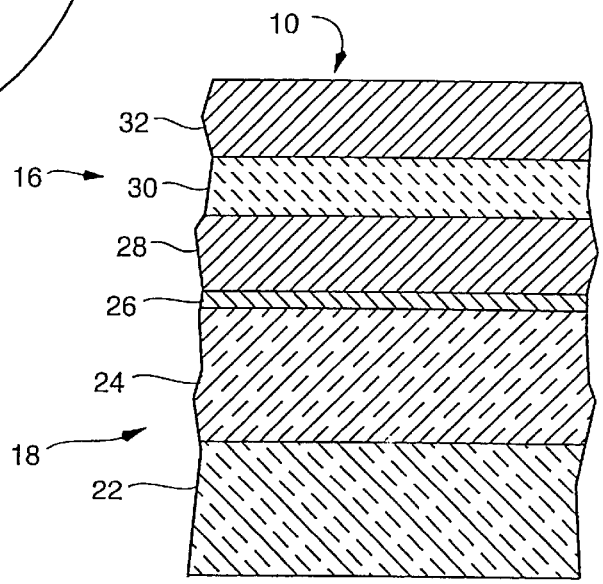
FIG. 3 is a portion of a cross-section of FIG. 2 taken through the lines 3—3, illustrating a thin film capacitor device fabricated by the process of FIG. 1.

Directing attention to FIGS. 2 and 3, a wafer 10 containing numerous capacitors 12, 14, 16, etc. is shown. FIG. 2 is a top view of the wafer 10 on which the thin film capacitors 12, 14, 16, etc. fabricated by the process according to the invention are shown greatly enlarged. FIG. 3 is a portion of a cross-section of FIG. 2 taken through the lines 3—3 bisecting capacitor 16. Referring to FIG. 3, the wafer 10 includes a silicon substrate 22, a silicon dioxide insulating layer 24, a thin layer of titanium 26 which assists the next layer, which is a platinum electrode 28, in adhering to the silicon dioxide 24, a layer of layered superlattice material 30, and another platinum electrode 32. After the layers 24, 26, 28, 30, and 32 are deposited, the wafer is etched down to layer 28 to form the individual capacitors 12, 14, 16, etc. which are interconnected by the bottom electrode 28. The invention primarily involves the method of creating the ferroelectric thin-film layer 30 of strontium bismuth thallium tantalate layered superlattice material. Layered superlattice materials comprise complex oxides of metals, such as strontium, calcium, barium, bismuth, cadmium, lead, titanium, tantalum, hafnium, tungsten, niobium, zirconium, bismuth, scandium, yttrium, lanthanum, antimony, chromium, and thallium that spontaneously form layered superlattices; i.e. crystalline lattices that include alternating layers of distinctly different sublattices. Generally each layered superlattice material will include two or more of the above metals; for example, barium, bismuth and niobium form the layered superlattice material barium bismuth niobate, $BaBi_2Nb_2O_g$. The material 30 may be a dielectric, a ferroelectric, or both. If it is a dielectric, the capacitor 16 is a dielectric capacitor, and if the material 30 is a ferroelectric, then capacitor 16 is a ferroelectric capacitor.

The layered superlattice materials may be summarized more generally under the formula:

$$A1_{w1}^{+a1}A2_{w2}^{+a2}\ldots Aj_{wj}^{+aj}S1_{x1}^{+s1}S2_{x2}^{+s2}\ldots S_{xk}^{+sk}B1_{y1}^{+b1}B2_{y2}^{+b2}\ldots B1_{yl}^{+bl}Q_z^{-2}, \quad (1)$$

where A1, A2 . . . Aj represent A-site elements in the perovskite-like structure, which may be elements such as strontium, calcium, barium, bismuth, lead, and others; S1, S2 . . . Sk represent superlattice generator elements, which is usually bismuth, but can also be materials such as yttrium, scandium, lanthanum, antimony, chromium, thallium, and other elements with a valence of +3; B1, B2 . . . Bl represent B-site elements in the perovskite-like structure, which may be elements such as titanium, tantalum, hafnium, tungsten, niobium, zirconium, and other elements; and Q represents an anion, which is generally oxygen but may also be other elements, such as fluorine, chlorine and hybrids of these elements, such as the oxyfluorides, the oxychlorides, etc. The superscripts in Formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, Formula (1) includes the cases where the unit cell may vary throughout the material, e.g. in $Sr_{0.75}Ba_{0.25}Bi_2Ta_2O_9$, on the average, 75% of the A-sites are occupied by a strontium atom and 25% of the A-sites are occupied by a barium atom. If there is only one A-site element in the compound, then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although Formula (1) is written in the more general form to include layered superlattice compounds as in the present invention, in which the superlattice generator has multiple elements, bismuth and thallium.

The value of z is found from the equation:

$$(a1w1+a2w2\ldots+ajwj)+(s1x1+s2x2\ldots+skxk)+(b1y1+b2y2\ldots+blyl)=2z. \quad (2)$$

Formula (1) includes all three of the Smolenskii type compounds. The layered superlattice materials do not include every material that can be fit into the Formula (1), but only those which spontaneously form themselves into crystalline structures with distinct alternating layers.

The layered superlattice materials do not include every material that can be fit into Formula (1), but only those ingredients which spontaneously form themselves into a layer of distinct crystalline layers during crystallization. This spontaneous crystallization is typically assisted by thermally treating or annealing the mixture of ingredients. The enhanced temperature facilitates self-ordering of the superlattice-forming moieties into thermodynamically favored structures, such as perovskite-like octahedra. The term "superlattice generator elements" as applied to S1, S2 . . . Sk, refers to the fact that these metals are particularly stable in the form of a concentrated metal oxide layer interposed between two perovskite-like layers, as opposed to a uniform random distribution of superlattice generator metals throughout the mixed layered superlattice material. In particular, bismuth has an ionic radius that permits it to function as either an A-site material or a superlattice generator, but bismuth, if present in amounts less than a threshold stoichiometric proportion, will spontaneously concentrate as a non-perovskite-like bismuth oxide layer.

Formula (1) at least includes all three of the Smolenskii-type ferroelectric layered superlattice materials, namely, those having the respective formulae:

$$A_{m-1}S_2B_mO_{3m+3};\qquad(3)$$

$$A_{m+1}B_mO_{3m+1};\text{ and}\qquad(4)$$

$$A_mB_mO_{3m+2},\qquad(5)$$

wherein A is an A-site metal in the perovskite-like superlattice, B is a B-site metal in the perovskite-like superlattice, S is a trivalent superlattice generator metal such as bismuth or thallium, and m is a number sufficient to balance the overall formula charge. Where m is a fractional number, the overall average empirical formula provides for a plurality of different or mixed perovskite-like layers.

It should also be understood that the term "layered superlattice material" herein also includes doped layered superlattice materials. That is, any of the material included in Formula (1) may be doped with a variety of materials, such as silicon, germanium, uranium, zirconium, tin or hafnium. For example, strontium bismuth tantalate may be doped with a variety of elements as given by the formula:

$$(Sr_{1-w}M1_w)(Bi_{1-x}S_x)_2(Ta_{1-y}M2_y)_2O_g+\alpha M3O\qquad(6)$$

where M1 may be Ca, Ba, Mg, or Pb, S is a superlattice generator selected from the group consisting of Y, Sc, La, Sb, Cr, Tl and mixtures thereof, M2 may be Nb, Bi, or Sb, with w, x and y being a number between 0 and 1, M3 may be Si, Ge, U, Zr, Sn, or Hf, and preferably $0 \leq \alpha \leq 0.05$. Materials included in this formula are also included in the term layered superlattice materials used herein.

Similarly, a relatively minor second component may be added to a layered superlattice material and the resulting material will still be within the invention. For example, a small amount of an oxygen octahedra material of the formula $ABO_3$ may be added to strontium bismuth tantalate as indicated by the formula:

$$(1-z)Sr(Bi_{1-x}S_x)_2Ta_2O_9+zABO_3,\qquad(7)$$

where A may be Bi, Sr, Ca, Mg, Pb, Y, Ba, Sn, and Ln; B may be Ti, Zr, Hf, Mn, Ni, Fe, and Co; and z is a number between 0 and 1, preferably, $0 \leq x \leq 0.2$.

Likewise the layered superlattice material may be modified by both a minor $ABO_3$ component and a dopant. For example, a material according to the formula:

$$(1-z)Sr(Bi_{1-x}S_x)_2Ta_2O_9+zABO_3,+\alpha MeO,\qquad(8)$$

where A may be Bi, Sb, Y and Ln; B may be Nb, Ta, and Bi; Me may be Si, Ge, U, Ti, Sn, and Zr; and z is a number between 0 and 1, preferably, $0 \leq z \leq 0.2$, is contemplated by the invention.

Figure 4:
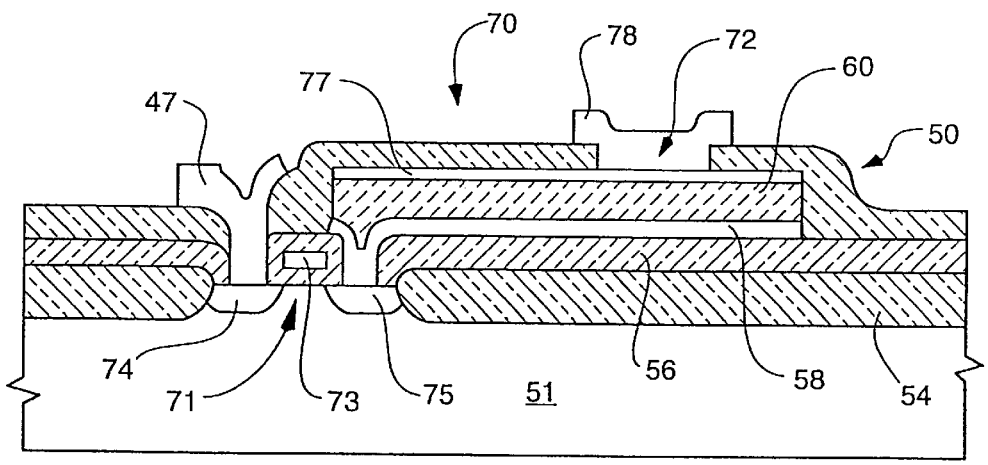
FIG. 4 is a cross-sectional illustration of a portion of an integrated circuit fabricated utilizing the process of the invention.

FIG. 4 shows an example of the integration of a layered superlattice capacitor 72 into a non-volatile ferroelectric memory cell to form an integrated circuit 70 such as may be fabricated using the invention. The memory cell 50 includes a silicon substrate 51, field oxide areas 54, and two electrically interconnected electrical devices, a transistor 71 and a ferroelectric switching capacitor 72. Transistor 71 includes a gate 73, a source 74, and a drain 75. Capacitor 72 includes first electrode 58, ferroelectric layered superlattice material 60, and second electrode 77. Insulators, such as 56, separate the devices 71, 72, except where drain 75 of transistor 71 is connected to first electrode 58 of capacitor 72. Electrical contacts, such as 47 and 78, make electrical connection from the devices 71, 72 to other parts of the integrated circuit 70. A detailed example of the complete fabrication process for an integrated circuit memory cell as shown in FIG. 4 is given in U.S. Pat. No. 5,561,307, which is hereby incorporated by reference as if fully contained herein. It should be understood that FIGS. 2, 3, 4 depicting the capacitors 12, 14, 16, etc. and integrated circuit 70 are not meant to be actual cross-sectional views of any particular portion of an actual electronic device, but are merely idealized representations which are employed to more clearly and fully depict the structure and process of the invention than would otherwise be possible.

This disclosure describes the fabrication and testing of numerous capacitors 12, 14, 16 having layers 22, 24, 26, 28, 30, and 32 made of the materials above, disclosing a wide spectrum of variations of the fabrication process according to the invention and a variety of different layered superlattice materials 30. It should be understood, however, that the specific processes and electronic devices described are exemplary; that is the invention contemplates that the layers in FIGS. 3 and 4 may be made of many other materials than those mentioned above and described below; there are many other variations of the process of the invention than can be included in a document such as this; and the method and materials may be used in many other electronic devices other than the capacitors, such as 12, 14, 16, etc. and the integrated circuit 70. It should also be noted that the word "substrate" is used in both a specific and a general sense in this disclosure. In the specific sense it refers to the specific silicon layer 22, conventionally called a silicon substrate, on which the exemplary electronic devices described are fabricated. In a general sense, it refers to any material, object, or layer on which another layer or layers are formed. In this sense, for example, the layers 22, 24, 26, and 28 comprise a substrate 18 for the layer 30 of strontium bismuth thallium tantalate layered superlattice material 30.

The term "stoichiometric" used herein may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $Sr(BiTl)Ta_2O_9$ and $Sr(Bi_{1.5}Tl_{0.5})Ta_2O_9$ are balanced stoichiometric formulas. In contrast, a precursor for strontium bismuth thallium tantalate in which the molar proportions of strontium, bismuth, thallium and tantalum 1, 2.2-x, x, and 2, respectively, is represented herein by the unbalanced "stoichiometric" formula $Sr(Bi_{1-x}Tl_x)_{2.2}Ta_2O_9$, since it contains excess bismuth and thallium beyond what is needed to form a complete crystalline material. In this disclosure an "excess" amount of a metallic element means an amount greater than required to bond with the other metals present to make the desired material, with all atomic sites occupied and no amount of any metal left over.

2. Detailed Description of the Fabrication Process

The process of making the precursor solutions includes several different steps. The first step includes providing a plurality of polyoxyalkylated metal moieties including at least one A-site metal moiety, at least one B-site metal moiety, and at least one superlattice-generator metal moiety. It is to be understood that the terms "A-site metal" and "B-site metal" refer to metals that are suitable for use in a perovskite-like lattice, but do not actually occupy A-site and B-site positions in solution. The respective metal moieties are combined in effective amounts for yielding, upon crystallization of the precursor solution, a mixed layered superlattice material. The combining step preferably includes mixing the respective metal moieties to substantial homogeneity in a solvent, with the addition of an excess amount of at least one of the respective metal moieties. A particularly preferred precursor design includes up to about twenty percent more superlattice generator elements in the precursor than is desired from a stoichiometric standpoint in the final mixed layered superlattice material. The most preferred range of superlattice generator excess is from about five to ten percent.

The present invention primarily concerns ferroelectric layered superlattice materials having the general formula represented by Formula (3), $A_{m-1}S_2B_mO_{3m+3}$, in which at least a portion of the superlattice generator elements represented by S is thallium. In particular, the invention is concerned primarily with the ferroelectric layered superlattice materials represented by the general formula:

$$A_{m-1}(S1_{y-x}S2_x)B_mO_{3m+3}$$

wherein S1 represents bismuth, S2 represents thallium, $2 \leq y \leq 2.4$ and $0 < x \leq y$. Preferably, the layered superlattice material comprises strontium bismuth thallium tantalate made from a precursor containing relative amounts of metalorganic compounds corresponding approximately to the following general chemical formula:

$$A_{m-1}(S1_{2.2-x}S2_x)B_mO_{3m+3},$$

where A is the element strontium, S1 is bismuth and S2 is thallium, B is tantalum, m=2 and $0 < x \leq 2.2$. Preferably, x=0.55.

Figure 1:
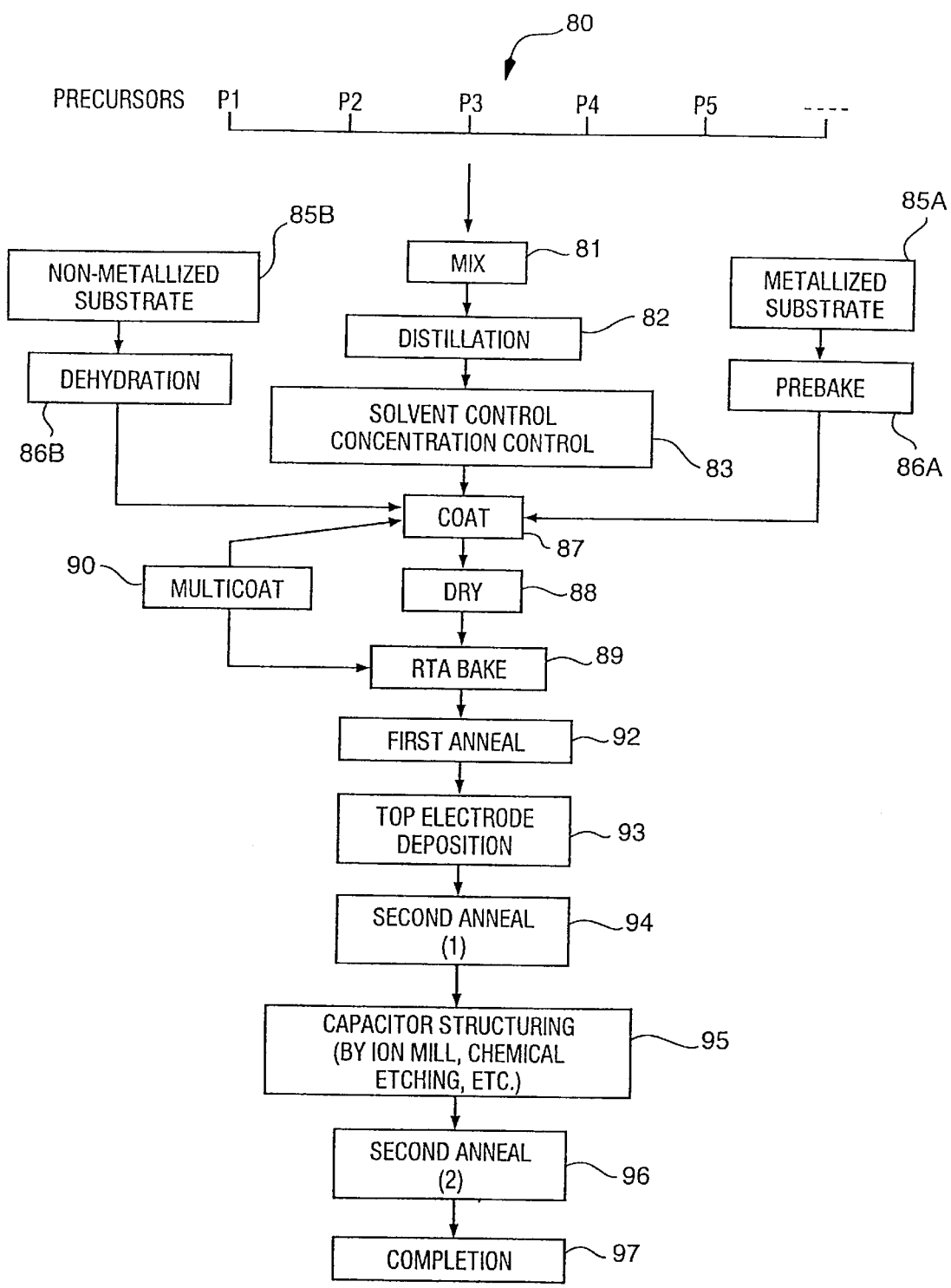
FIG. 1 is a flow chart showing the preferred embodiment of a process for preparing a thin film of a layered superlattice material according to the invention.

A flow chart of the preferred embodiment of a process according to the invention for preparing a thin film of a layered superlattice material, such as 30 and 60, and a device, such as 10 and 70 incorporating the material 30 and 60, is shown in FIG. 1. We shall first review each step of the preferred process briefly, and then discuss the individual steps in more detail and provide examples of the process. The first step 80 of the process is the preparation of the precursor or precursors, P1, P2, P3, etc. In FIG. 1, the dotted lines next to P5 in step 80 indicate the possibility of one or more additional precursors. In the preferred embodiment the precursors are liquids in which a compound or compounds of the metals to comprise the thin film layer 30 of layered superlattice material are dissolved. The precursors are then mixed in step 81, and the mixed precursors are distilled in step 82. Then follows a solvent control and/or concentration control step 83. Generally this step is taken over two stages which may be separated considerably in time. In the first stage the mixed precursor is dissolved in a suitable solvent and concentrated so as to provide a long shelf life. Just before use, the solvent and concentration may be adjusted to optimize the electronic device that results from the process. The final precursor contains metal moieties in effective amounts for spontaneously forming the desired layered superlattice material upon drying and heating said precursor.

In parallel with the solvent and concentration control step 83, the substrate 18 is prepared. If the substrate is a metallized substrate, such as the substrate 18, then the substrate is provided in step 85A by forming the layers 22, 24, 26, and 28 and is then prebaked in step 86A. If the substrate is a non-metallized substrate, such as a silicon or gallium arsenide single crystal, the substrate is provided in step 85B and dehydrated in step 86B. In step 87 the substrate is coated with the precursor. In the examples discussed below, the coating was done by a spin-on process, though a process such as a misted deposition process as described in U.S. Pat. No. 5,540,772, which is hereby incorporated by reference, or dipping or other suitable coating process may be used. The coated substrate is then dried in step 88, and then baked in an RTP (rapid thermal processor) unit. If the desired thickness of the layer 30 is not obtained, then the series of coat, dry, and RTP bake steps 87, 88, and 89 are repeated as many times as required to build up the desired thickness. The wafer 10 is then annealed in step 92, the top or second electrode 32 is deposited in step 93 by sputtering or other suitable process, and the wafer 10 is then, optionally, annealed again in step 94. The capacitor 16 is then structured by ion milling, chemical etching, or other suitable process in step 95. Then follows, in step 96, a second "second anneal" step, which will be the third anneal if step 94 was done. This completes the process if a capacitor device as in FIG. 2 is the desired end result; however, in the case of an integrated circuit as in FIG. 4, there follows completion steps 97 such as contact metallization, capping, etc. As will be discussed further below, not all of the steps outlined above are necessary for every device; some steps are optional and others are used only for certain layered superlattice materials. It is a feature of the invention that the prebake step 86A, the dry step 88, the RTP bake step 89, the first anneal 92, and the second anneal steps 94 and 96, and in particular the dry, RTP bake and anneal steps all involve temperatures lower than 725° C., and preferably of 650° C. and lower.

Precursor solutions and their preparation in step 80 are discussed in detail in U.S. Pat. No. 5,423,285, which is hereby incorporated by reference. Generally a metal or a metal compound is reacted with a carboxylic acid, such as 2-ethylhexanoic acid, to produce a metal hexanoate, which is dissolved in a suitable solvent or solvents, such as xylenes. Other metal-organic acid esters in addition to the 2-ethylhexanoates that may be used for suitable precursors when compounded with a metal are the acetates and acetylacetonates. For some metals, such as titanium, the precursor metal compound may comprise a metal alkoxide, such as titanium 2-methoxyethoxide. Other alkoxides that may be compounded with a metal and used as precursor compounds include the methoxides, ethoxides, n-propoxide, iso-propoxides, n-butoxides, iso-butoxides, tert-butoxides, 2-methoxyethoxides, and 2-ethoexyethoxides. The precursor metal compound is preferably dissolved in a solvent having a boiling point greater than the boiling point of water, i.e., 100° C. This, in combination with the heating steps in making the precursor, which preferably are performed at temperatures of 115° C. and higher, results in a precursor that is essentially anhydrous. A xylenes solvent works for most metals. For highly electropositive elements, the solvent preferably includes 2-methoxyethanol or n-butyl acetate. Some solvents that may be used, together with their boiling points, include: alcohols, such as 1-butanol (117° C.), 1-pentanol (117° C.), 2-pentanol (119° C.), 1-hexanol (157° C.), 2-hexanol (136° C.), 3-hexanol (135° C.), 2-ethyl-1-butanol (146° C.), 2-methoxyethanol (124° C.), 2-ethoxyethanol (135° C.), and 2-methyl-1-pentanol (148° C.); ketones, such as 2-hexanone (methyl butyl ketone) (127° C.), 4-methyl-2-pentanone (methyl isobutyl ketone) (118° C.), 3-heptanone (butyl ethyl ketone) (123° C.), and cyclohexanone (156° C.); esters, such as butyl acetate (127° C.), 2-methoxyethyl acetate (145° C.), and 2-ethoxyethyl acetate (156° C.); ethers, such as 2-methoxyethyl ether (162°

C.) and 2-ethoxyethyl ether (190° C.); and aromatic hydrocarbons, such as xylenes (138° C.–143° C.), toluene (111° C.) and ethylbenzene (136° C.).

The precursors of the individual metals may be made separately and then mixed, but generally they are all made together in the same container and mixed as they are made. After mixing, the precursor solution may be distilled to remove water and other undesirable impurities and by-products of the preparation process, although if the precursors and solvents are available in pure enough states, the distillation step 82 may be skipped. The solvent type and concentration may then be adjusted in step 83 either to prepare it for coating, if the coating is to be done immediately, or to provide a precursor with a long shelf life. If the solvent control steps are such as to prepare a solution with a long shelf life, then just before coating, another adjustment will usually be done to optimize the thin film. Some adjustments to produce a long shelf life and to produce high quality films are discussed in detail in U.S. Pat. 5,423,285. These may include a solvent exchange step and/or the addition of a co-solvent to provide a solvent that produces a better quality film than the solvent in which the precursor was stored.

In steps 85A and 86A, or steps 85B and 86B, a substrate is provided and prepared for coating. Almost any substrate that will support a thin film and is compatible with the materials and processes described herein may be used. Some of these substrates include oxidized or non-oxidized silicon or gallium arsenide semiconducting wafers, with or without integrated circuits and/or metallized layers added, plates of silicon or glass, and other electronic device chips. For the exemplary devices of this disclosure, the substrates were metallized substrates 18 as shown in FIG. 3. The fabrication of the substrate 18 is described in detail in U.S. Pat. No. 5,423,285 referred to above, and will not be repeated herein. While platinum with a titanium adhesion layer, or platinum alone, are the metallizations used in the examples discussed, numerous other metals may be used such as platinum with an adhesion layer of tantalum, tungsten, molybdenum, chromium, nickel or alloys of these metals, and titanium nitride. Sputtering or vacuum deposition is the preferred deposition process, though other metallization processes may be used. Heating of the substrates during the metallization deposition is effective to increase adhesion. It has been found that prebaking of the metallized substrate at a temperature that is higher than or equal to the temperature of any of the subsequent processes performed on the wafer 10, which processes are described below, is usually necessary to optimize the electronic properties of the thin film 30. The prebaking step 86A comprises baking in an oxygen atmosphere, preferably at a concentration of between 20% and 100%, and at a temperature of between 500° C. and 1000° C., and preferably 650° C., prior to the coating step 87. Preferably the wafer 10 is baked in a diffusion furnace. The substrate prebake step 86A removes water and organic impurities from the substrate surface. More importantly, the prebaking decreases the internal stress of the metal layer 28 through the annealing effect of the prebaking and the partial oxidation and interdiffusion of the adhesion layer 26 metal. All this increases the adhesion between the substrate 18 and the layered superlattice film 30 and minimizes the peeling problem. Further, if the adhesion layer 26 is a transition metal, the partial oxidation stabilizes the metal chemically. Therefore, the number of mobile atoms penetrating into the layered superlattice layer 30 through the platinum layer 28 is drastically decreased, and the layered superlattice material layer 30 crystallizes smoothly without defects due to the diffused ions. If the substrate is not metallized, then the silicon or other wafer is dehydrated at a lower temperature.

The precursor mixing, distillation, solvent control, and concentration control steps 81, 82, and 83 have been discussed separately and linearly for clarity. However, these steps can be combined and/or ordered differently depending on the particular liquids used, whether one intends to store the precursor-or use it immediately, etc. For example, distillation is usually part of solvent concentration control, as well as being useful for removing unwanted by-products, and thus both functions are often done together. As another example, mixing and solvent control often share the same physical operation, such as adding particular reactants and solvents to the precursor solution in a predetermined order. As a third example, any of these steps of mixing, distilling, and solvent and concentration control may be repeated several times during the total process of preparing a precursor.

The mixed, distilled, and adjusted precursor solution is then coated on the substrate 18. Preferably, the coating is done by a spin-on process. The preferred precursor solution concentration is 0.01 to 0.50 M (moles/liter), and the preferred spin speed is between 500 rpm and 5000 rpm.

The spin-on process and the misted deposition process remove some of the solvent, but some solvent remains after the coating. This solvent is removed from the wet film in a drying step 88. At the same time, the heating causes thermal decomposition of the organic elements in the thin film, which also vaporize and are removed from the thin film. This results in a solid thin film of the layered superlattice material 30 in a precrystallized amorphous state. This dried film is sufficiently rigid to support the next spin-on coat. The drying temperature must be above the boiling point of the solvent, and preferably above the thermal decomposition temperature of the organics in precursor solution. The preferred drying temperature is between 150° C. and 400° C. and depends on the specific precursor used. The drying step may comprise a single drying step at a single temperature, or multiple step drying process at several different temperatures, such as a ramping up and down of temperature. The multiple step drying process is useful to prevent cracking and bubbling of the thin film which can occur due to excessive volume shrinkage by too rapid temperature rise. An electric hot plate is preferably used to perform the drying step 88.

The drying step 88 is optionally followed by an RTP bake step 89. Radiation from a halogen lamp, an infrared lamp, or an ultraviolet lamp provides the source of heat for the RTP bake step. Preferably, the RTP bake is performed in an oxygen atmosphere of between 20% and 100% oxygen, at a temperature between 450° C. and 725° C., and preferably 650° C., with a ramping rate between 1° C./sec and 200° C./sec, and with a holding time of 5 seconds to 300 seconds. Any residual organics are burned out and vaporized during the RTP process. At the same time, the rapid temperature rise of the RTP bake promotes nucleation; i.e., the generation of numerous small crystalline grains of the layered superlattice material in the solid film 30. These grains act as nuclei upon which further crystallization can occur. The presence of oxygen in the bake process is essential in forming these grains.

The thickness of a single coat, via the spin process or otherwise, is very important to prevent cracking due to volume shrinkage during the following heating steps 88, 89, and 92. To obtain a crack-free film, a single spin-coat layer must be less than 2000 Å (200 nanometers) after the bake step 89. Therefore, multiple coating is necessary to achieve film thicknesses greater than 2000 Å. The preferred film fabrication process includes RTP baking for each spin-on coat. That is, as shown in FIG. 1, the substrate 18 is coated, dried, and RTP baked, and then the process 90 is repeated as often as necessary to achieve the desired thickness. However, the RTP bake step is not essential for every coat. One RTP bake step for every two coats is practical, and even just one RTP bake step at the end of a series of coats is strongly effective in improving the electronic properties of most layered superlattice ferroelectrics. For a limited number of specific precursor/layered superlattice material compositions, particularly ones utilizing concentrations of bismuth in excess of stoichiometry, the RTP bake step 89 is not necessary.

Once the desired film thickness has been obtained, the dried and preferably baked film is annealed in step 92, which is referred to as a first anneal to distinguish it from subsequent anneals. The first anneal is preferably performed in an oxygen atmosphere in a furnace. The oxygen concentration is preferably 20% to 100%, and the temperature is above the crystallization temperature of the particular layered superlattice material 30. To prevent evaporation of elements from the layered superlattice material 30 and to prevent thermal damage to the substrate, including damage to integrated circuits already in place, the annealing temperature preferably does not exceed 650° C. Preferably, the annealing for strontium bismuth thallium tantalate is done at about 650° C. for five hours, and is in a similar range for most other layered superlattice materials. If five hours is too long for a particular integrated circuit device, then the first anneal may be reduced. However, less than three hours of annealing at 650° C. results in unsaturated hysteresis loops. Three hours annealing provides adequate saturation, and additional annealing increases the polarizability, 2Pr. Again, the presence of oxygen is important in this first anneal step. The numerous nuclei, small grains generated by the RTP bake step, grow, and a well-crystallized ferroelectric film is formed under the oxygen-rich atmosphere.

After the first anneal, the second or top electrode 32 is formed. Preferably, the electrode is formed by RF sputtering of a platinum single layer, but it also may be formed by DC sputtering, ion beam sputtering, vacuum deposition or other appropriate deposition process. If desirable for the electronic device design, before the metal deposition, the layered superlattice material 30 may be patterned using conventional photolithography and etching, and the top electrode 32 is then patterned in a second process after deposition. In the examples described herein, the top electrode 32 and layered superlattice material 30 are patterned together using conventional photolithography techniques and ion beam milling.

As deposited, the adhesion of the top electrode 32 to the layered superlattice material is usually weak. Preferably, the adhesion is improved by a heat treatment. The wafer 10 including the layered superlattice film 30 covered by the top electrode 32 may be annealed before the patterning step 95 described above in a heat treatment designated in FIG. 1 as the second anneal (1) step 94, after the patterning step 95 by a heat treatment designated in FIG. 1 as the second anneal (2) step 96, or both before and after the patterning step 95. The second anneal is preferably performed in an electric furnace at a temperature between 500° C. and the first anneal temperature. A second anneal below 500° C. does not improve the adhesion of electrode 32, and the resulting capacitor devices are sometimes extremely leaky, and shorted in the worst cases.

The second anneal releases the internal stress in the top electrode 32 and in the interface between the electrode 32 and the layered superlattice material 30. At the same time, the second annealing step 94 or 96 reconstructs microstructure in the layered superlattice material 30 resulting from the sputtering of the top electrode, and as a result improves the properties of the material. The effect is the same whether the second anneal is performed before or after the patterning step 95. The effect of oxygen ambient during the second anneal is not as clear as it is in the case of RTP bake 89 and the first anneal 92, because the layered superlattice material 30 is covered by the top electrode and not exposed to the ambient atmosphere. With regard to most electrical properties, inert gas, such as helium, argon, and nitrogen may be used with approximately the same result as with oxygen. However, it has been found that an oxygen atmosphere during the second anneal improves the crystallographic order at the interface of the electrode 32 and layered superlattice material 30 as well as the symmetry of the hysteresis curve.

3. Example of the Fabrication Process and Property Dependence

Below is an example of the fabrication process according to the invention as applied to a wafer 10 as shown in FIGS. 2 and 3. The remanent polarization charge 2Pr in the capacitors was measured at applied voltages ranging from one through ten volts. The corresponding coercive field, 2Ec, was also measured at each voltage. The coercive field is a measure of the size of the field that is required to switch the material from one polarization state to another. For a practical electronic device, it should be high enough that stray fields will not cause polarization switching, but if it is too high, large voltages will be required to operate the device. Other parameters and terms used in the figures and discussion should be clear from the context.

EXAMPLE 1

Capacitors containing strontium bismuth thallium tantalate ferroelectric material were fabricated on silicon wafers. The relative proportions of the superlattice generator elements, bismuth and thallium, in the precursor solution were varied to correspond to the stoichiometries represented by $Sr(Bi_{2.2-x}Tl_x)Ta_2O_{9.3}$, where x=0, 0.55, 1.65, and 2.2. The anneal steps were performed at 650, 700, 750, or 800° C. The remnant polarizations, 2Pr, and the coercive fields of the capacitors from 0.75 to 10 volts were measured. Wafers 10, including a number of capacitors 12,14,16, etc., were fabricated in which the layered superlattice material 30 was strontium bismuth thallium tantalate. The precursor solution comprised strontium 2-ethylhexanoate, bismuth 2-ethylhexanoate, thallium 2-ethylhexanoate, and tantalum 2-ethylhexanoate in a xylenes solvent. The plural "xylenes" is used instead of the singular "xylene", because commercially available xylene includes three different fractionations of xylene. The four metal 2-ethylhexanoates were mixed in a proportion such that the strontium, bismuth, thallium and tantalum were present in the mixed precursor in proportions given by the formula $Sr(Bi_{2.2-x}Tl_x)Ta_2O_{9.3}$, where x=0, 0.55, 1.65, and 2.2. That is, the precursor included 2.2 mole-equivalents of bismuth and/or thallium for each 1.0 mole-equivalents of strontium and 2.0 mole-equivalents of tantalum. The molarity of the solution was approximately 0.2 moles per liter. The precursor was diluted to 0.13 moles per liter by the addition of n-butyl acetate. For each wafer, a substrate 18 comprising a single crystal silicon layer 22, a 500 nanometer (nm) thick layer 24 of silicon dioxide, a 50 nm thick layer 26 of titanium, and a 200 nm thick layer of platinum was prebaked at 700° C. in a diffusion furnace for 30 minutes with an oxygen flow of 6 liters/min. An eyedropper was used to place 1 ml of the $Sr(Bi_{2.2-x}Tl_x)Ta_2O_{9.3}$ precursor solution on the substrate 18. The wafer was spun at 1500 RPM for 30 seconds. The wafer 10 was then placed on a hot plate and baked in air at about 150° C. for 2 minutes and then at 260° C. for another 4 minutes. The wafer 10 was then RTP baked at a temperature corresponding to the respective anneal temperature with a ramping rate of 125° C./sec, a hold time of 30 seconds, a natural cool time of 6 minutes, and an ambient oxygen flow of approximately 100–200 cc/minute. The RTP temperature was 650° C. for wafers to be annealed at 650 or 700° C. The RTP temperature was 750° C. for wafers to be annealed at 750 or 800° C. The steps from using an eyedropper to deposit solution on the wafer through RTP baking were repeated for another coat. The wafer was then transferred to a diffusion furnace and annealed at 650, 700, 750, or 800° C. in an oxygen flow of 4 l/min for 60 minutes, with a push-pull of 5.6 inch/min for 10 minutes. The top layer 32 of 200 nm platinum was sputtered, a negative resist was spun-on at 5000 rpm for 30 seconds, followed by a standard photo mask process, an ion mill etch, an IPC strip and a second anneal at the same temperature as the first anneal in an oxygen flow of about 4 l/min for 30 minutes. The final thicknesses of the strontium bismuth thallium tantalate layered superlattice films 30 were in the range of about 1900–2100 Å.

Figure 5:
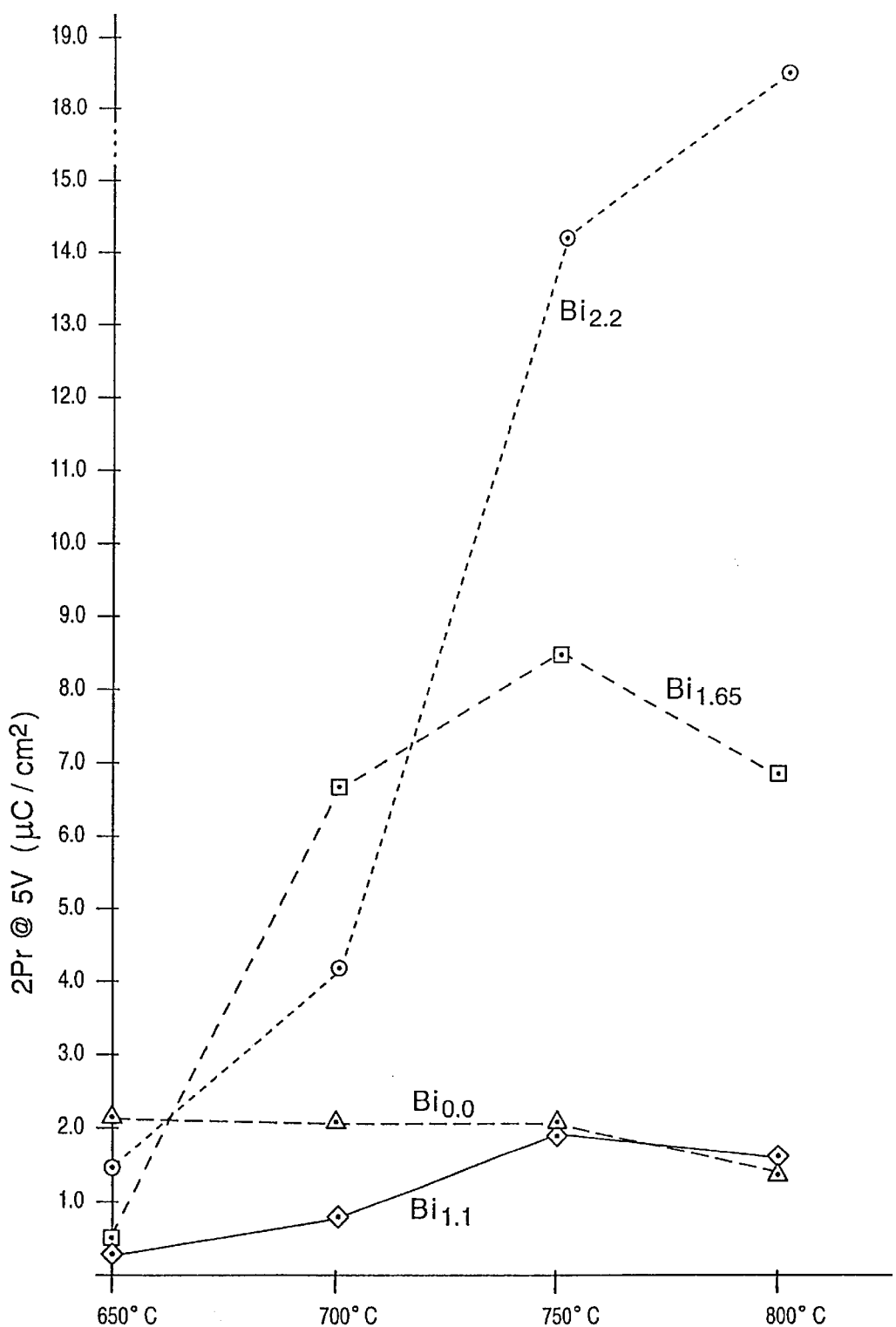
FIG. 5 shows a graph of 2Pr@5V values ($\mu C/cm^2$) plotted as a function of anneal temperature in strontium bismuth thallium tantalate capacitors where the mole ratio, Bi/Tl, of bismuth to thallium in the precursor solution is varied, as expressed by the formula subscript, 2.2-x, of Bi in the stoichiometric formula $$SrBi_{2.2-x}Tl_xTa_2O_{9.3}, \text{ where } 0\leq x \leq 2.2.$$

Table 1 contains the measured values of remanent polarization measured at 5 volts, 2Pr@5V, of capacitors fabricated from precursors containing different relative proportions of bismuth and thallium, and annealed at various temperatures. FIG. 5 is a graph of data selected from Table 1. Comparison of the data indicates that in fabrication processes in which higher anneal temperatures can be tolerated, that is, at temperatures exceeding 750° C., it is probably better to use bismuth alone as the superlattice generator element in the precursor solution. But, if the fabrication process can tolerate only lower temperatures, that is, about 700° C. and below, then it is better to substitute thallium for some or all of the bismuth in the precursor solution. At an anneal temperature of 700° C., the highest value of 2Pr@5V measured was 6.68 $\mu C/cm^2$ in capacitors made from the precursor containing the Bi:Tl mole ratio 1.65:0.55, corresponding to the stoichiometric formula $Sr(Bi_{1.65}Tl_{0.55})Ta_2O_{9.3}$. This value is an improvement of approximately 60 percent over the 2Pr-value in the bismuth-only capacitor. The corresponding 2Ec-value α@5V in the 1.65:0.55 capacitors was about 127 KV/cm, compared to 62 KV/cm in the 2.2:0.0 capacitor.

TABLE 1

| Bi:Tl mole ratio Formula | 2 Pr-value @ 5V ($\mu C/cm^2$) | | | |
|---|---|---|---|---|
| | Anneal Temperature | | | |
| Subscripts | 650° C. | 700° C. | 750° C. | 800° C. |
| 0.0:2.2 | 2.09 | 2.05 | 2.11 | 1.38 |
| 0.55:1.65 | 0.62 | 0.72 | 0.59 | 0.53 |
| 1.1:1.1 | 0.43 | 0.78 | 2.04 | 1.61 |
| 1.65:0.55 | 0.50 | 6.68 | 8.46 | 6.88 |
| 2.2:0.0 | 1.48 | 4.19 | 14.55 | 18.47 |

Measurement Temperature: 25° C.
Film Thicknesses: 1900–2150 Å
Measurement Frequency: 10,000 Hz At an anneal temperature of 650° C., the highest value of 2Pr@5V measured was 2.09 $\mu C/cm^2$ in capacitors made from the precursor containing the Bi:Tl mole ratio 0.0:2.2, corresponding to the stoichiometric formula $SrTl_{2.2}Ta_2O_{9.3}$. The 2Pr-value in the bismuth-only capacitors was about 1.48. The corresponding 2Ec-value @5V in the 0.0:2.2 capacitors after annealing at 650° C. was about 250 KV/cm, compared to 54 KV/cm in the 2.2:0.0 capacitor.

The values of 2Pr@5V measured in the preliminary experiment described here are lower than desired for many integrated circuit applications. The results of Example 1, nevertheless, demonstrate that substitution of thallium as a superlattice generator element effectively improves remanent polarization under critical process conditions in the temperature range of about 650 to 725° C. Use of thallium results in better ferroelectric properties than if only bismuth is used as the superlattice generator element at lower process temperatures. Also, it is believed that the ferroelectric properties in capacitors can be improved over the preliminary experimental results by using preferred fabrication conditions. For example, preferably the first anneal is conducted for five hours. As explained in reference to FIG. 1 above, annealing less than three hours results in unsaturated hysteresis loops, and additional annealing increases polarizability. The total annealing time of the samples in Example 1 was only 70 minutes. When it is critical in a fabrication process to limit both the temperature and the duration of anneal and other heat treatment steps, then careful selection of temperature, duration, and thalliumcontent can maximize ferroelectric properties within the given process constraints. Also, careful selection of material components, such as electrode material, can improve ferroelectric properties.

There has been described processes and compositions for making electronic devices utilizing layered superlattice materials using only process temperatures of 700° C. or less. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. It is also evident that the steps recited may in some instances be performed in a different order; or equivalent structures and process may be substituted for the various structures and processes described; or a variety of different dimensions and materials may be used. Consequently, the invention is to be construed as embracing each and every novel feature and novel combination of features present in and/or possessed by the fabrication processes, electronic devices, and electronic device manufacturing methods described.

We claim:

1. A ferroelectric device in an integrated circuit comprising a thin film of layered superlattice material containing thallium, wherein said thin film contains metal moieties in amounts corresponding to the general formula $A_{m-1}(S1_{y-x}S2_x)B_mO_{3m+3}$, wherein S1 represents bismuth, S2 represents thallium, $2 \leq y \leq 2.4$ and $0 < x \leq y$, A is an A-site element in the perovskite-like crystal structure of said layered superlattice material, and B is a B-site element in said perovskite-like crystal structure of said layered superlattice material.

2. A ferroelectric device as in claim 1 wherein A represents strontium and B represents tantalum.

3. A ferroelectric device as in claim 2 wherein m=2 and y=2.2.

4. A ferroelectric device as in claim 3 wherein x=0.55.

5. A precursor comprising metal moieties for spontaneously forming a ferroelectric layered superlattice material upon drying and heating of said precursor wherein said precursor contains metal moieties in amounts corresponding to the general formula $A_{m-1}(S1_{y-x}S2_x)B_mO_{3m+3}$, wherein S1 represents bismuth, S2 represents thallium, $2 \leq y \leq 2.4$ and $0 < x \leq y$, A is an A-site element in the perovskite-like crystal structure of said layered superlattice material, and B is a B-site element in said perovskite-like crystal structure of said layered superlattice material.

6. A precursor as in claim 5 wherein A represents strontium and B represents tantalum.

7. A precursor as in claim 6 wherein m=2 and y=2.2.

8. A precursor as in claim 7 wherein x=0.55.

\* \* \* \* \*

UNITED STATES PATENT AND TRADEMARK OFFICE
CERTIFICATE OF CORRECTION

PATENT NO. : 6,362,503 B1  Page 1 of 1
DATED : March 26, 2002
INVENTOR(S) : Shinichiro Hayashi and Carlos A. Paz de Araujo It is certified that error appears in the above-identified patent and that said Letters Patent is hereby corrected as shown below:

<u>Title page,</u>
Item [76], Inventor, delete "Shinichiro Hayashi, 2-9-3-301 Nasahara, Takatsuki, Osaka 569-1041" and insert -- Shinichiro Hayashi, Osaka, Japan, Carlos A. Paz de Araujo, Colorado Springs, CO --
Item [73], Assignees, insert -- Symetrix Corporation, Colorado Springs, CO (US); Matsushita Electric Industrial Co., Ltd. (Japan) --.

Signed and Sealed this

Fifteenth Day of October, 2002

*Attest:*

JAMES E. ROGAN
*Director of the United States Patent and Trademark Office*

*Attesting Officer*